(12) United States Patent
Newns et al.

(10) Patent No.: US 6,649,929 B2
(45) Date of Patent: Nov. 18, 2003

(54) QUANTUM COMPUTING WITH D-WAVE SUPERCONDUCTORS

(75) Inventors: Dennis M. Newns, Yorktown Heights, NY (US); Chang C. Tsuei, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/150,035

(22) Filed: May 16, 2002

(65) Prior Publication Data

US 2003/0094606 A1 May 22, 2003

Related U.S. Application Data

(63) Continuation of application No. 09/475,791, filed on Dec. 30, 1999.

(51) Int. Cl.[7] .................................................. H01L 39/22
(52) U.S. Cl. ............................ 257/31; 257/32; 257/36; 505/190; 505/193
(58) Field of Search ............................ 257/31, 32, 36; 505/190, 193

(56) References Cited

U.S. PATENT DOCUMENTS

| | | |
|---|---|---|
| 4,168,441 A | 9/1979 | McDonald et al. |
| 5,487,304 A | 1/1996 | Sanzari |
| 5,624,885 A | 4/1997 | Tanaka et al. |
| 5,723,925 A | 3/1998 | Kambe et al. |
| 5,831,278 A | 11/1998 | Berkowitz |
| 5,883,051 A | 3/1999 | Ishimaru et al. |
| 5,940,193 A | 8/1999 | Hotaling et al. |
| 5,981,443 A | 11/1999 | Wen |
| 6,016,433 A | 1/2000 | Mizuno et al. |
| 6,025,713 A | 2/2000 | Morooka et al. |
| 6,111,268 A | 8/2000 | Mannhart et al. |
| 2001/0020701 A1 * | 9/2001 | Zagoskin .................. 25/31 |

FOREIGN PATENT DOCUMENTS

| | | |
|---|---|---|
| EP | 0 401 765 | 5/1990 |
| JP | 9 321358 | 12/1997 |
| JP | 9 326514 | 12/1997 |

OTHER PUBLICATIONS

Blatter et al. "Design aspects of superconducting–phase quantum bits" Physical Review B, vol. 63, 174511 (2001).*
Tsuei et al. "Pairing Symmetry and Flux Organization in a Tricrystal Superconducting Ring of YBa2Cu3O7–5", Phys. Rev. Lett., 73, 593, (1994).
Tsuei et al., "Pure dx2–y2 Order Parameter Symmetry in the Tetragonal Superconductor Tl2Ba2CuO6+5", Nature 387.
K. Char et al., "Bi–epitaxial Grain Boundary Junction in YBa2Cu3O7", Appl. Phys. Lett, 59, 733 (1991).
Ahn et al., "Electrostatic Modulation of Superconductivity in Ultrathin GdBa2Cu3O7–I Films", Science, 284, 1152 (1999).
Loss et al., Quantum computation with quantum dots, Phys. Rev., A57, 120, (1998).

(List continued on next page.)

*Primary Examiner*—Nathan J. Flynn
*Assistant Examiner*—Ahmed N. Sefer
(74) *Attorney, Agent, or Firm*—McGinn & Gibb, PLLC; Marian Underweiser, Esq.

(57) ABSTRACT

A method and structure for a d-wave qubit structure includes a qubit disk formed at a multi-crystal junction (or qubit ring) and a superconducting screening structure surrounding the qubit. The structure may also include a superconducting sensing loop, where the superconducting sensing loop comprises an s-wave superconducting ring. The structure may also include a superconducting field effect transistor.

18 Claims, 6 Drawing Sheets

OTHER PUBLICATIONS

Leggett et al., Dynamics of the dissipative two–state system, Rev. Mod, Phys. 59, 1 (1987).

Loss, Daniel and David P. DiVicenzo. Quantum Computation with Quantum Dots, In Physical Review A, vol. 57, No. 1 Jan. (1998).

Y. Nakamura et al., Coherent control of macroscopic quantum states in a single–Cooper pair box, Nature 398, 786 (1999).

L.B. Loffe et al., "Environmentally decoupled SDS–wave Josephson Junctions for Quantum Computing", Nature 398, 679 (1999).

A.M. Zagoskin, A Scalable, tunable Qubit on a clean DND or Grain Boundary–D Junction: cond–mat/9903170, Mar. 10, (1999).

Blais et al., Operation of universal gates in a DXD superconducting solid state quantum computer, quantum–ph/9905043, May 13, 1999.

Gariglio et al., Electrostatic Modulation of Superconductivity in Ultrathin GdBa2Cu3O7–x Films, vol 284 Science, May 14, 1999.

Chuang et al., "Experimental Realization of a Quantum Algorithm Nature", vol. 393, pp. 143–146, 1998.

Ludwig et al., "High–Tc Multilayer Magnetometers with Improved 1/f Noise", IEEE Tran. on Appl. Superconductivity, vol. 5, No. 2, Jun. 1995.

Gershenfeld et al., "Bulk Spin–Resonance Quantum Computation", Science, vol. 275, pp. 350–356 (1997).

* cited by examiner

QUANTUM COMPUTING WITH D-WAVE SUPERCONDUCTORS

CROSS-REFERENCE TO RELATED APPLICATIONS

This application is a continuation of U.S. application Ser. No. 09/475,791 filed Dec. 30, 1999.

BACKGROUND OF THE INVENTION

1. Field of the Invention

The present invention generally relates to superconductors, and more particularly to a d-wave quantum bit which permits large-scale integration of quantum bits for use with quantum computers.

2. Description of the Related Art

A practical design of a quantum computer requires hundreds to thousands of quantum bits ("qubits"), but up to now realizations of qubits by methods such as nuclear magnetic resonance (NMR) seem unsuitable for the miniaturization required to enable a many-qubit machine to be constructed at reasonable cost (.g., see Gershenfeld, et al. Bulk Spin-Resonance Quantum Computation, Science, Vol 275, pp 350–356 (1997) and Chuang et al. *Experimental realization of a quantum algorithm* Nature Vol 393, pp 143–146 (1998), incorporated herein by reference).

Quantum computers promise enormous speed. However, quantum computing can only be realized if the quantum computing device (quantum computer, quamputer) is built on a scale of at least several thousand qubits. The inherent scalability of solid state devices and the high level of expertise existing in conventional industrial electronics and experimental mesoscopic physics make solid state-based quamputers an attractive choice.

Quantum coherence preservation (e.g., maintenance of the quantum state for any useful time period) within a single qubit, is a major problem, also when several qubits are placed in close proximity, they tend to electromagnetically interfere with each other and destroy any charge/signal which is stored in adjacent qubits.

The macroscopic coherent ground state and gapped excitation spectrum in superconductors are favorable situations for coherence preservation. As discussed in greater detail below, the invention comprises a qubit implementation in solid state integrated circuit technology which can support LSI (Large Scale Integration). The quantum computer chip is operable at very low (milliKelvin) temperatures, which are required to ensure purity of quantum states and to minimize noise.

SUMMARY OF THE INVENTION

It is, therefore, an object of the present invention to provide a structure and method for a d-wave qubit structure that includes a qubit disk formed at a multi-crystal junction (or a superconducting qubit ring) and a superconducting screening structure (e.g., ring or disk) surrounding the qubit. The structure may also include a superconducting sensing loop, where the superconducting sensing loop comprises an s-wave and/or d-wave superconducting ring. The superconducting screening ring may include at least one weak link, driven to the normal state by a means such as a superconducting field effect transistor, or a laser beam.

The multi-crystal junction comprises a junction (e.g. disk) of differently aligned controlled orientation high temperature superconductor crystalline structures or a superconducting ring. The relative orientations of the grains of the crystalline structures are chosen such that the superconducting screening ring spontaneously generates a half-integer quantum of flux at some or all of the grain boundary intersection points. The superconducting screening ring comprises one of cuprate, niobium or lead. The invention also includes an array of such quantum bit structures and a quantum computer including the quantum bit structures

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1A:
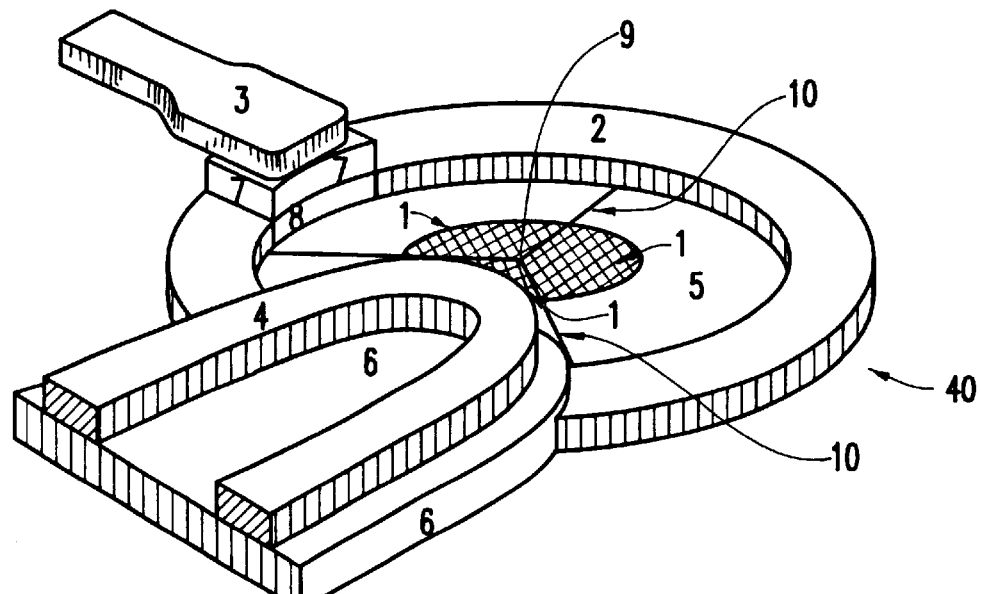
FIG. 1A is a schematic diagram of a perspective view of the inventive d-wave qubit.
Figure 2:
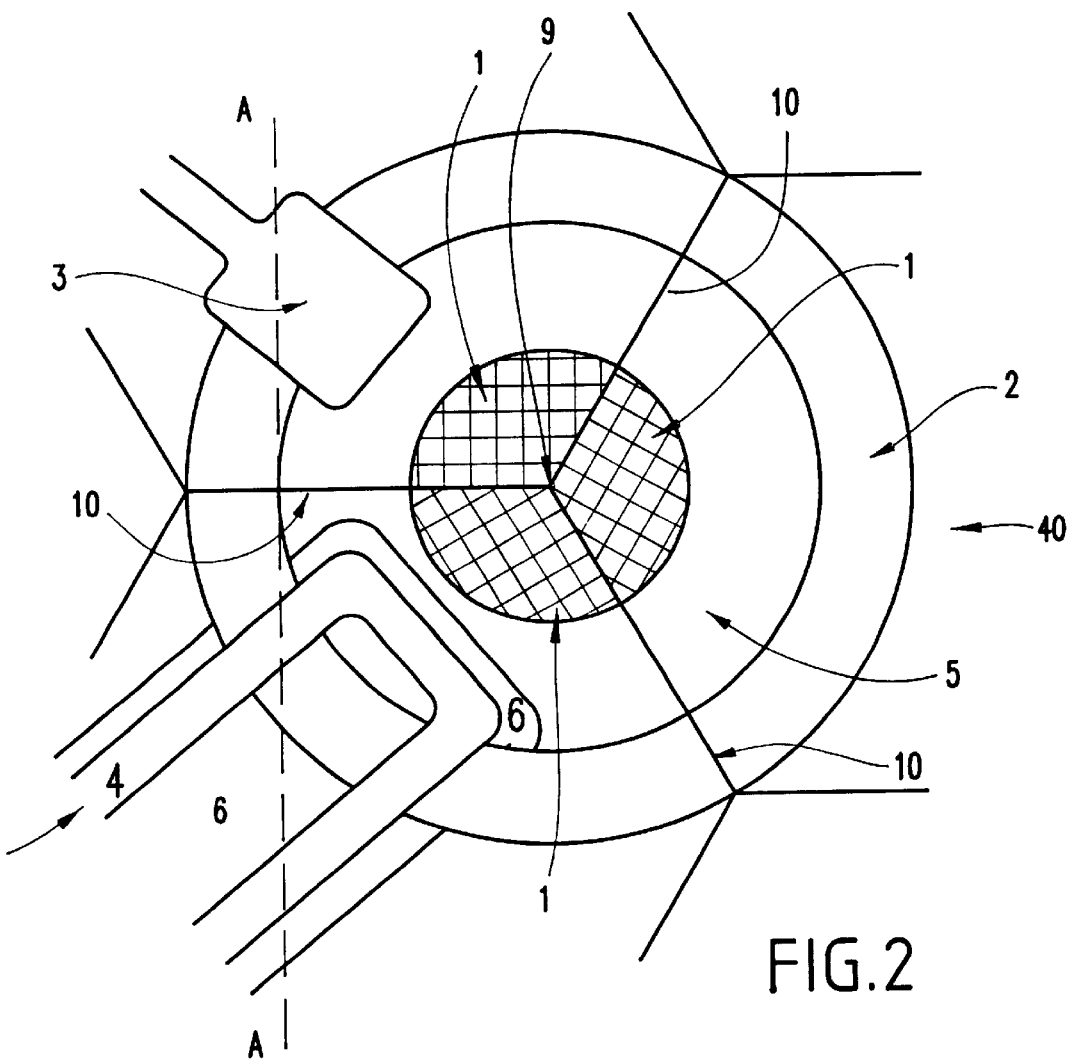
FIG. 2 is a schematic diagram of a top view of the inventive d-wave qubit.
Figure 3:
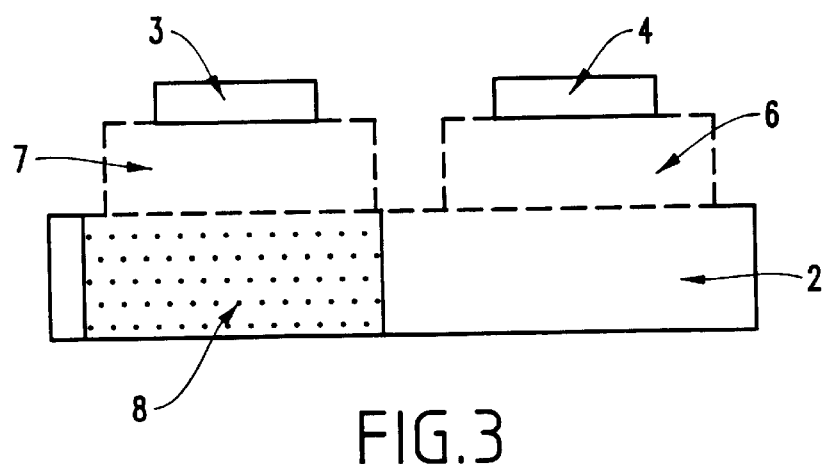
FIG. 3 is a schematic diagram of a cross-sectional view of the inventive d-wave qubit.

Referring now to the drawings, and more particularly to FIG. 1A, a perspective drawing of one embodiment of the inventive d-wave superconductor qubit structure 40 is illustrated. FIG. 2 is a top view of the same structure and FIG. 3 is a cross-sectional view along a middle portion of line A—A in FIG. 2.

A qubit 9 is located at the junction of differently aligned high temperature superconductor crystalline structures 1 with grain boundary Josephson junctions 10 separating the regions 1 of different orientation. This is referred to herein as a "multi-crystal" junction or, for example, if there are three differently aligned regions it is termed herein a "tricrystal" junction. While this embodiment illustrates three differently aligned crystalline structures, as would be known by one ordinarily skilled in the art given this disclosure, any number of differently oriented crystalline structures could be utilized with the invention.

Figure 4:
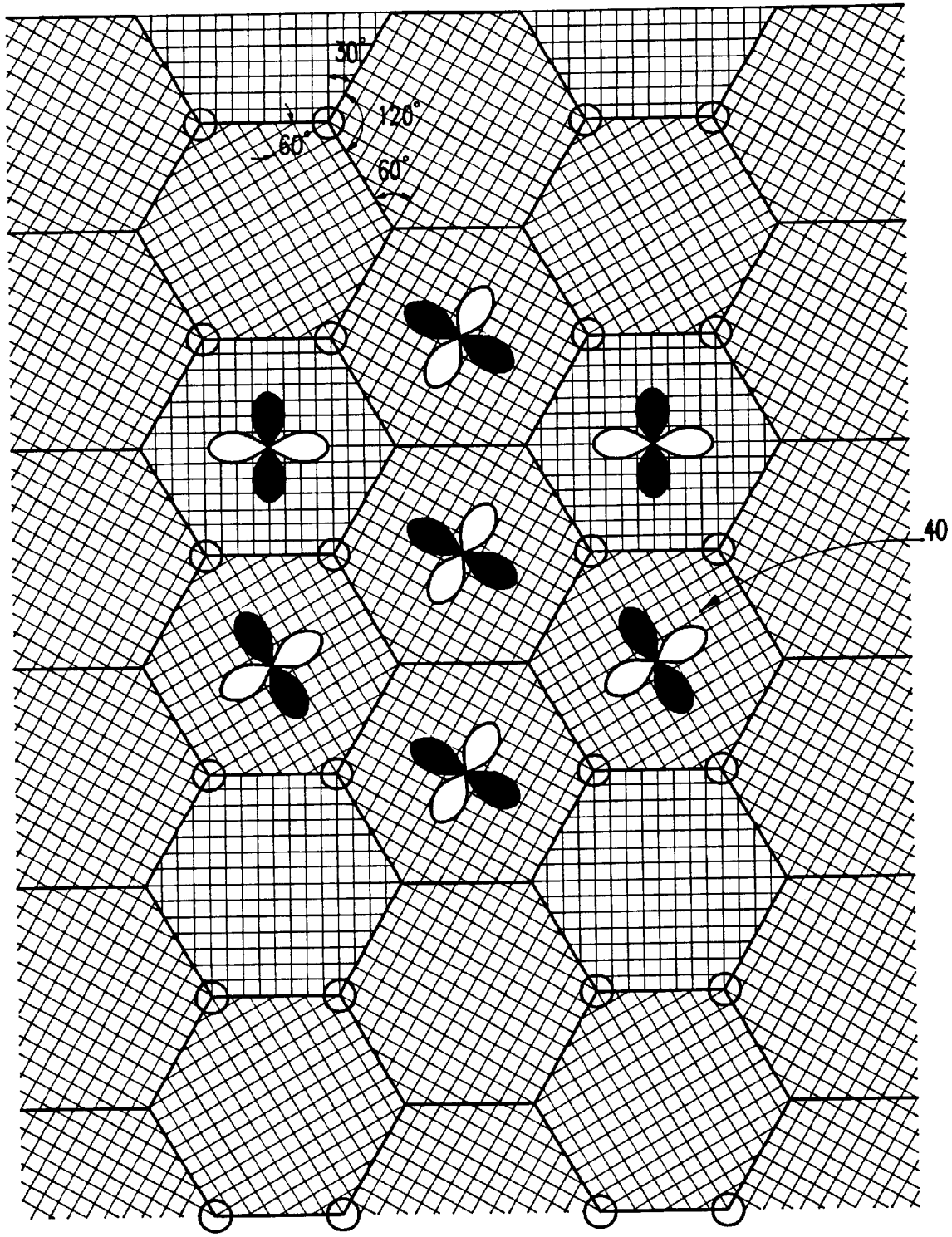
FIG. 4 is a schematic illustration of a top view of a possible type of substrate used to form used to form the inventive d-wave qubits.
Figure 5:
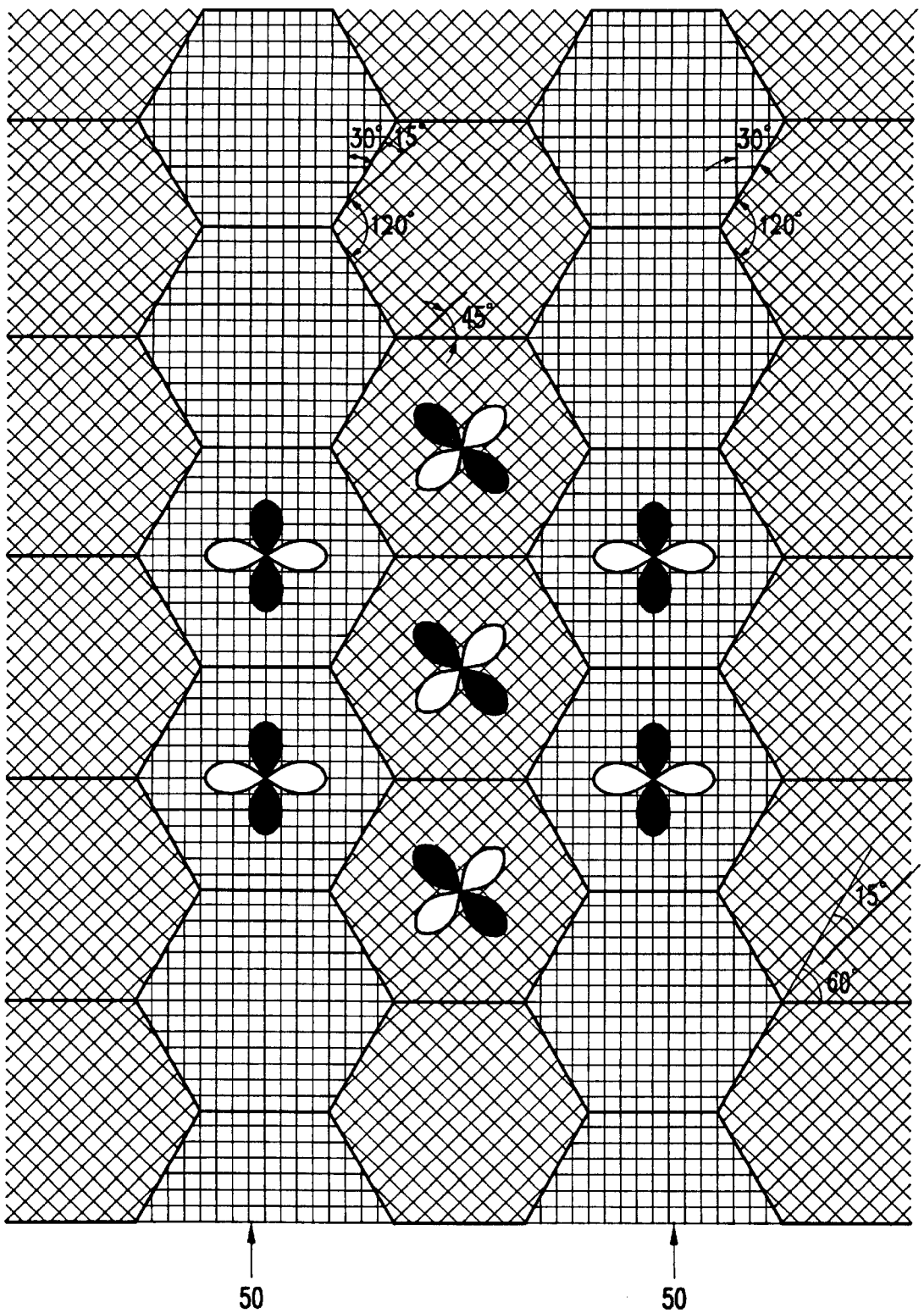
FIG. 5 is a schematic illustration of a top view of a second possible type of substrate used to form the inventive d-wave qubits.

In a preferred embodiment, the crystalline structure I comprises a high temperature crystalline superconducting material (e.g., (100) SrTiO3(STO) or YSZ (Yttrium stabilized Zirconia)) deposited epitaxially on a substrate. As shown in FIGS. 4 and 5, the relative orientations of the hexagonal grains 1 are chosen so that when a d-wave cuprate superconductor 9 (e.g., YBCO, Bi2212, etc.) is deposited (epitaxially) upon the multigrain substrate 1, the orientation of the d-wave superconducting order parameter, in the differently-oriented crystalline regions, generates a half-integer quantum of flux at some or all of the 3-grain boundary interjection points (see Tsuei et al. "Pairing Symmetry and Flux Organization in a Tricrystal Superconducting Ring of $YBa_2Cu_3O_{7-\delta}$", Phys. Rev. Lett., 73, 593, 1994, and Tsuei et al., "Pure $d_{x^2-y^2}$ Order Parameter Symmetry in the Tetragonal Superconductor $Tl_2Ba_2CuO_{6+\delta}$", Nature, 387, 481, 1997, incorporated herein by reference).

The inventive structure also includes a screening isolation ring 2 (d-wave or s-wave) which surrounds the crystalline material 1. The screening ring 2 comprises a d-wave ring formed of Cuprate, or an s-wave ring formed from Niobium (Nb) or Lead (Pb) fabricated, for example, by conventional deposition.

One can achieve a similar array of d-wave qubits by means of a biepitaxial film growth technique. (e.g., K. Char et al., "Bi-epitaxial Grain Boundary Junctions in $YBa_2Cu_3O_7$", Appl. Phys. Lett, 59,733 (1991), incorporated herein by reference).

Figures 9A, 9B:
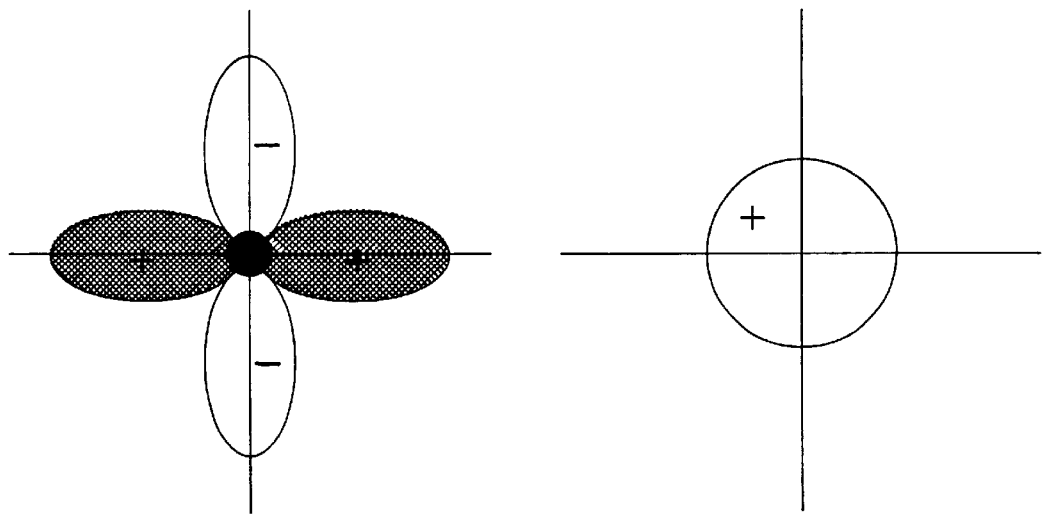
FIG. 9A shows a "d-wave" order parameter.
FIG. 9B shows a "s-wave" order parameter.

The material is called a "d-wave" superconductor because it has a d-wave order parameter as shown in FIG. 9A instead of an "s-wave" order parameter shown in FIG. 9B (which describes the conventional low-Tc superconductors such as Pb, Nb, etc.).

Figure 1B:
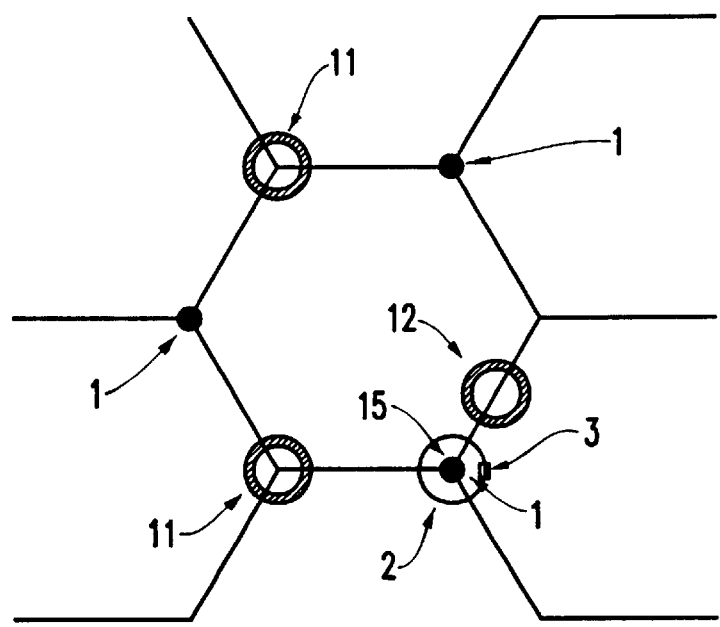
FIG. 1B is a schematic diagram of a top view of the inventive d-wave qubit formed at one of many intersections of different crystalline structures.

The inventive multi-grain structures such as those shown in FIGS. 4 and 5 can be used as a platform for the placement of qubits and related integrated circuits for quantum computing. An example (referring to the multi-grain structure of FIG. 5) is shown in FIG. 1B.

The multigrain substrate 1 can be used as a platform for implementing qubits and related integrated circuits (e.g., control circuitry) for quantum computing. A qubit based on half-integer magnetic flux states can be fabricated by patterning (e.g., removing) the cuprate to form an insulating region 5 around any of the tri-grain intersection points 9. The screening ring 2 is separated from the crystal structure 1 and both are formed on the insulator 5 (e.g., oxide substrate) which is devoid of cuprate. The insulating ring 5 preferably has a mean diameter of 1–20 microns, and a 1–20 micron gap between the edge of the crystalline structure1 and the edge of the screening ring 2. The screening ring/loop 2 prevents adjacent qubits from interfering with each other. The crystalline intersections which will become qubits are defined by material removal (e.g, cuprate etching) which forms the insulating loop/ring 5.

In addition, a superconductor field effect transistor (SUFET) controlled by a gate electrode 3 is used to activate or deactivate the screening ring 2. The SUFET gate 3 is insulated from the d-wave screening ring 2 by a gate insulator 7. Further, a low carrier concentration material or a local constriction in the screening 8 forms the channel of the SUFET. For example, the local carrier material preferably comprises a low carrier concentration form of cuprate superconductor. If the gate 3 is negative, carriers are induced in the channel 8, which makes the screening ring 2 superconducting. It has been demonstrated (Ahn et al., "Electrostatic Modulation of Superconductivity in Ultrathin $GdBa_2Cu_3O_{7-1}$ Films", Science, 284, 1152 (1999) incorporated herein by reference, that the channel is then superconducting. When the gate 3 is at zero and positive relative to the channel 8, the channel 8 is insulating and the screening ring 2 is not superconducting.

A control/sensing loop 4, that is insulated from the screening ring 2 by an insulating layer 6 passes over the d-wave screening ring 2. The control/sensing loop 4 performs two functions. First, the control/sensing loop 4 senses the flux $\Phi$ in the qubit 9. Secondly, the control/sensing loop 4 functions as a single input gate when it applies pulsed magnetic filed to the qubit. In another embodiment, separate loops can be used for these two functions. It needs to be a superconductor to successfully sense the small magnetic flux from qubit 9, as done in Tsuei et al., supra.

When functioning as a single input gate to the qubit, the control/sensing loop (as shown in FIG. 1A) generates a magnetic field perpendicular to the plane of the substrate. To perform certain quantum gate operations, it may be necessary to apply an in-plane magnetic field to the qubits. This can be accomplished by using the technique of microstrip and/or stripline, a well-established technology in superconductory electronic devices.

As discussed above, item 1 is a qubit. This is shown in FIG. 1A as a disk of d-wave superconductor film 1. Alternatively, a smaller ring (or a loop) 15 of d-wave superconductor film positioned within the screening ring 2 can operate as the qubit. The shield ring 2 is in the off-state when a laser beam is incident on the weak-link. Alternatively, if a SUFET is used, the shield ring is normally in the off-state, unless a negative voltage is applied to the SUFET 3.

Shown in FIG. 1B are two types of on-chip SQUIDs (superconducting quantum interference device) 11,12 that can be fabricated in the multi-grain substrate. These SQUIDs 11, 12 constitute an important part of the integrated circuits for computing operations. More specifically, the two types of SQUIDs include: $\pi$-SQUIDs 11, located at the tricrystal point (characterized by a phase-shift of $\pi$ in the SQUID loop); and 0-SQUIDS 12, zero phase-shift which can be located at any point along any slant grain boundaries in the multi-grain substrates (see FIGS. 4 and 5).

As mentioned above, the invention is not limited to the geometrical orientation of the substrate region in FIGS. 4 and 5 and an alternative design for an array of qubits is, for example, a composite strontium titanate (STO) substrate, which could be formed to include multi-crystal grains located wherever a qubit is desired.

All of the above discussed structures can be formed using any conventional fabrication process, such as successive deposition and lithographic patterning, epitaxial processing, etc. Thus, as illustrated above, the invention comprises a type of qubit ("d-wave qubit") that is suitable for an integrated circuit environment.

In one form, as illustrated in FIG. 4, the invention comprises an array of the inventive d-wave qubits 40 fabricated on an oxide substrate 5. In this multi-grain design, a qubit can be formed only at the tricrystal intersecting points indicated by a circle in FIG. 4. Once again, the qubits 9 are formed at the intersection points. In the tricrystal example discussed above, the crystalline regions are oriented at 120°, 30°, and 60° to each other, respectively, as shown in FIG. 4.

To the contrary, in FIG. 5, the crystalline regions are oriented at 120°, 45°, and 15° to each other, respectively. This creates, at each of these tri-crystal intersection points, the inventive d-wave qubit.

In FIG. 4, the misorientation angle between two cuprate grains is 60° or 30°. In FIG. 5, the misorientation angle between two cuprate grains is 45° or 0° (equivalently 90°). In the multi-grain design shown in FIG. 5, a qubit can be formed at every corner of the hexagons. Such different orientations provide different reactions between the adjacent qubits when the screening ring 2 is removed/deactivated which, as would be known by one ordinarily skilled in the art given this disclosure, can be used to make different types of logic or memory circuits, etc.

The multiple-Josephson junction d-wave superconductor loops are capable of spontaneously generating a half flux quantum of magnetic field in either 'up' or 'down' orientation (see Tsuei et al., supra). In the language of Quantum Mechanics, these states can be written as |up> and |down> Quantum states respectively.

With the inventive qubit design, especially with small overall dimensions, quantum mechanical hybridization between the |up> and |down> magnetic flux states occurs, resulting in a splitting into a ground state $|0>=c(|up>+|down>)$ and an excited state $|1>=c(|up>-|down>)$ of the ring (where c is a normalization constant). This situation is referred to as Quantum Coherence. This two level quantum system can be placed in any coherent combination state (a|up>+b|down>), where a and b are constants, and constitutes a quantum bit of information or d-wave qubit. The d-wave qubit, unlike the case of a conventional s-wave superconducting loop, has the desirable property that, in the absence of a magnetic field, the eigenstates of the system are exactly $10>=c(|up>+|down>)$ and $11>=c(|up>-|down>$ (due to intrinsic time-reversal invariance).

The key characteristics required of a qubit are (see Bennett, supra, and Loss, Daniel and David P. DiVicenzo. *Quantum Computation with Quantum Dots*, In Physical Review A, Vol. 57, No. 1 January 1998 incorporated herein by reference), a high degree of quantum phase coherence (see Table II below) (this is the most essential characteristic), the capability of being influenced by an external device (e.g., the control/sensing loop 4), the capability of being sensed by an external device (e.g., the control/sensing loop 4), and the capability for multiple qubits to be controllably placed in interaction with each other.

The invention achieves all of these key requirements. Quantum coherence is the persistence (e.g., maintenance) of the quantum state over many times its intrinsic period. The Josephson junction d-wave superconducting loop 40 has adequate quantum coherence (e.g., see Table II, below). Further, the inventive qubit 40 is capable of being influenced by an external magnetic field (see Tsuei et al., 1994, 1997, supra) and of being sensed by a proximate s-wave (or d-wave) Josephson junction loop (see Tsuei et al., 1994, 1997, supra).

To implement the inventive d-wave qubit circuit with the existing solid state microfabrication technology, the invention includes the controlled-orientation multigrain substrate 1 (e.g., FIGS. 1 and 2), discussed above. With the design shown in FIGS. 4 and 5, the shortest separation distance between qubits is determined by the size of the hexagons (of the order of 100 to 1000 microns). The inter-qubit separation needs to be relatively large of this order (e.g., 500 microns) to aid magnetic insolation of the qubits from each other, and to leave room for ancillary components.

In order to maintain their time evolution in an independent manner, the qubits are magnetically isolated from each other by the d-wave or s-wave ring 2. However, this magnetic screening can be selectively removed to allow adjacent qubits to communicate, thereby forming a 2-input quantum gate.

More specifically, the superconductivity of two or more adjacent screening rings 2 may be turned off by the application of a focused laser beam, which temporarily converts a selected ring or rings 2 to the normal state by raising the temperature above the superconducting point, or the application of voltage to the gate 3 of the superconducting field effect transistors of the adjacent qubits (which temporarily disables the screening rings 2), or by other means (e.g., see Leggett et al. *Dynamics of the Dissipative Two-State System* reviews of Modern Physics Vol 59, No 1 (1987), and references cited therein, all of which are incorporated herein by reference).

When the magnetic isolation is removed, there is a dipole-dipole interaction, which (in the described geometry) is proportional to the dot product of the magnetic moments of the two interacting qubits. Thus, without functioning screening rings 2 in place, a conventional Heisenberg interaction occurs between adjacent qubits, allowing information (data) to be transferred between qubits.

Figure 6:
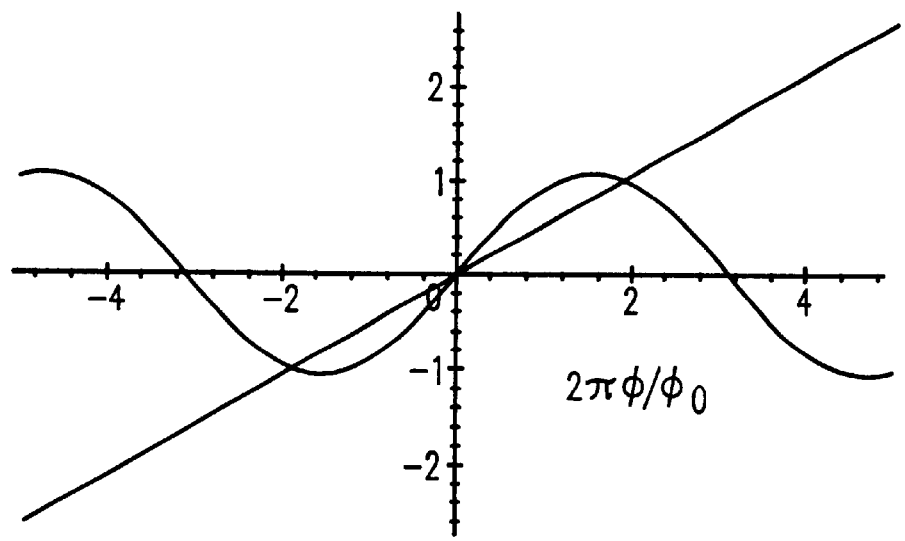
FIG. 6 is a graph illustrating classical formation of a plus or minus half (or approximately half) flux quantum.
Figure 7:
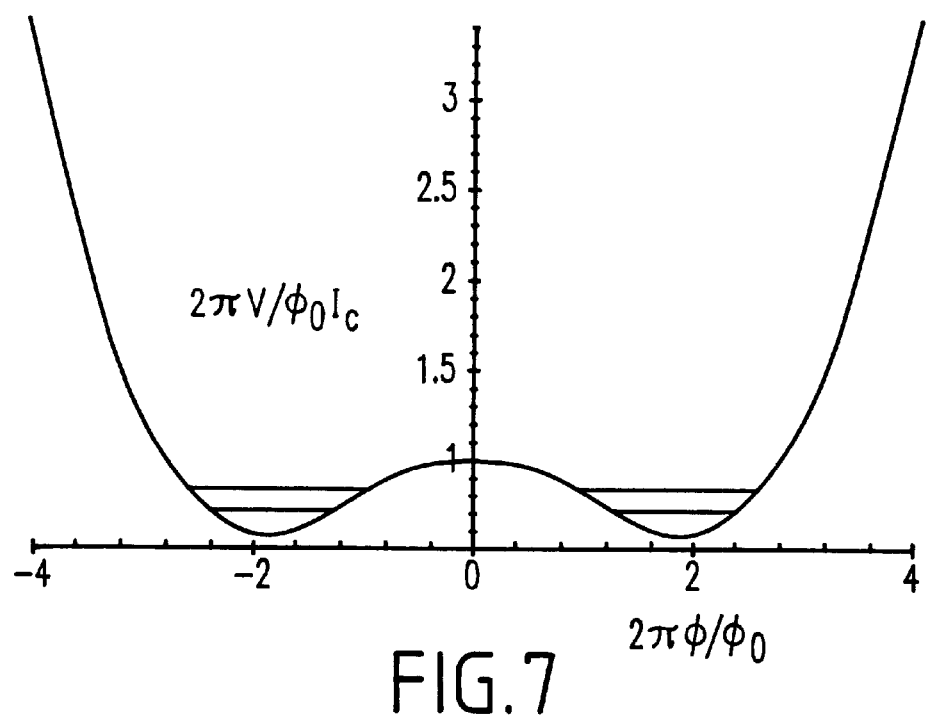
FIG. 7 is a graph illustrating the classical twin well potential provided by the inventive qubit structure.

FIG. 6 is a graph illustrating formation of a plus or minus half (or approximately half) flux quantum at the intersection of the line with the line curve, provided $LI_c > \Phi/2\pi$. The quantum mechanical hybridization, in the classical twin well potential provided by the inventive qubit structure, is illustrated in FIG. 7. There is a degree of freedom for which the potential has the twin-well structure illustrated in FIG. 7, and for which the mass is the capacitance of the Josephson junction (e.g., see Table I below and prior discussion). The interwell barrier in FIG. 7 depends on the ring inductance. Interwell tunneling (FIG. 7) is important to establishing the splitting between the ground and excited states and this is aided by light mass (low capacitance) and low barrier of the superconductor structure.

Figure 8:
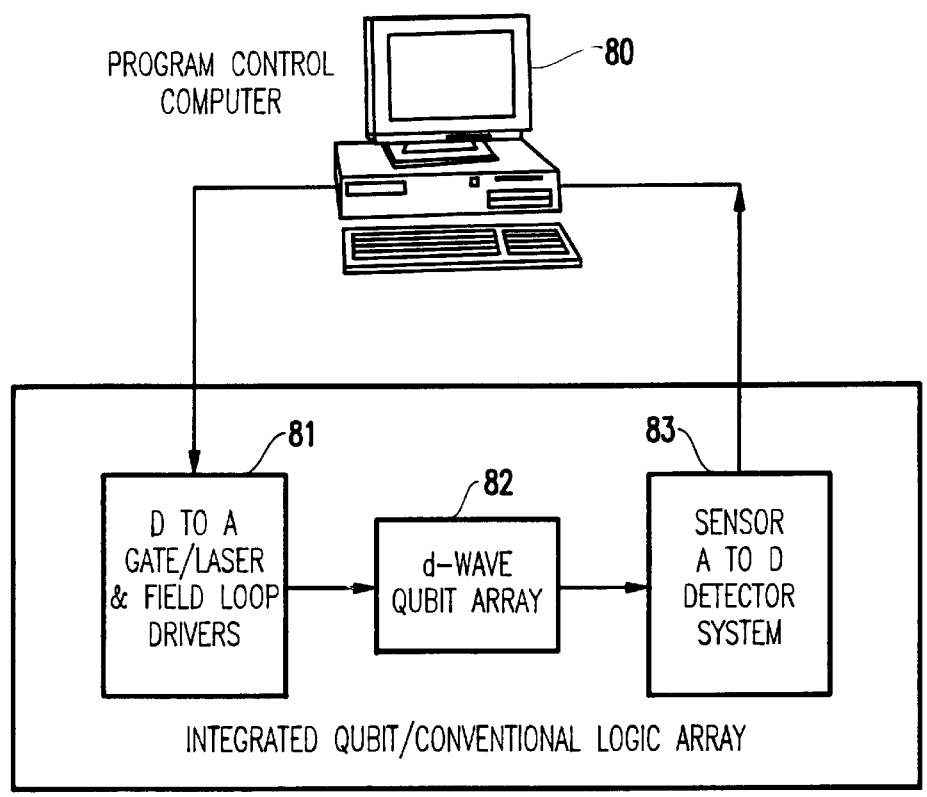
FIG. 8 is a schematic diagram of a quantum computer according to the invention.

The invention can be embodied in any number of different types of systems (e.g., quantum computers) and executed in any number of different ways, as would be known by one ordinarily skilled in the art. For example, as illustrated in FIG. 8, a typical configuration of quantum computer system in accordance with the invention preferably has a Program Control Computer (PCC) 80 of conventional type such as a PC. One role of the PCC's first function will be to actuate the sensor loops 3 (alternatively, separate actuator and sensor loops could be provided) with a precise current and for a precise time to perform the single input gate function. For this purpose, on-chip electronics, (e.g., executed in standard Si circuitry) will perform the required digital to analog (D to A) gate/laser and filed loop driver function 81.

Secondly, the state of a qubit array 82 will be analyzed by the sensor loops and the on-chip analog to digital (A to D) converters 83. The information will be returned to the PCC 80.

A third PCC function uses the SUFET gates or laser devices to open for an accurately specified time, a pair of selected superconducting guard rings of two selected qubits so as to form a two input quantum gate.

A fourth PCC function, using a measurement protocol including sensor and actuation (when present) loops, calibrates the gate in a way so that precise currents and times required to be programmed into the gate operations are determined. The calibration operation preferably precedes a production run on the quantum computer. Hence, the PCC 80 is useful in controlling the operation of the quantum computer.

The following treatment of the invention is based on a single Josephson junction superconductor ring, which can be performed (without loss of generality) using C to represent total effective junction capacitance and defining the single junction to have a π–phase shift.

The Larangian for an LCJπ-Ring 2 is as follows. In terms of Flux Φ through Ring, which is treated as a parallel LCJ circuit, whose Lagrangian is $$L = \frac{1}{2}C\left(\frac{d\Phi}{dt}\right)^2 - \frac{\Phi_0 I_c}{2\pi}\cos\left(\frac{2\pi\Phi}{\Phi_0}\right) - \frac{1}{2L}\Phi^2, \quad (1)$$

where $I_c$ is the critical current of the junction.
The Lagrange equation of motion is $$C\frac{d^2}{dt^2}\Phi = I_c \sin\left(\frac{2\pi\Phi}{\Phi_0}\right) - \Phi/L. \quad (2)$$

A nontrivial stationary solution only exists if $$LI_c \frac{2\pi}{\Phi_0} > 1$$

(see FIG. 6),
This is quantized by $$\frac{d\Phi}{dt} = \frac{i\hbar}{2\pi C}\frac{d}{d\Phi} \quad (3)$$

whence the Hamiltonian becomes $$H = \frac{-\hbar^2}{2C}\frac{d^2}{d\Phi^2} + \frac{\Phi_0 I_c}{2\pi}\cos\left(\frac{2\pi\Phi}{\Phi_0}\right) + \frac{1}{2L}\Phi^2. \quad (4)$$

Note that C is mass, in both classical and quantum formulations. Without the Josephson term, this is a Harmonic Oscillator with frequency $$\omega_0 = 1/\sqrt{LC} \quad (5)$$

e.g. if $L=20\times10^{-12}$H, and $C=2.2\times10^{-15}$F, then $\omega_0=4.7\times10^{12}$ Hz.

With the Josephson term the potential is as illustrated in FIG. 7.

Consider the rescaled problem in terms of $h=H/(\hbar\omega_0)$:

$$h = -\frac{1}{2}\frac{d^2}{2dx^2} + \alpha\cos(ax) + \frac{1}{2}x^2 \quad (6)$$

where $$\Phi = bx; \quad b^2 = \frac{\hbar\sqrt{L}}{2\pi\sqrt{C}}, \quad \text{hence } a^2 = \frac{(2e)^2}{\hbar}\sqrt{\frac{L}{C}}, \quad (7)$$

and $\alpha = E_J/(\hbar\omega_0)$, where $$E_J = \frac{\Phi_0 I_c}{2\pi}.$$

Taking the variational function $$\psi = \exp(-\gamma(x-x_0)^2) \pm \exp(-\gamma(x+x_0)^2), \quad (8)$$

with upper sign for bonding and lower sign for antibonding state. For this trial function, the energy in units of $\hbar\omega_0$ is $E/\hbar\omega_0 = T+V_0+V_1$, where $$T = \frac{\gamma}{2} \mp \frac{2\gamma^2 x_0^2 s}{1\pm s}, \quad (9)$$

$$V_0 = \frac{1}{8\gamma} + \frac{x_0^2/2}{1\pm s},$$

$$V_1 = \alpha e^{\frac{-\alpha^2}{8\gamma}}\left(\frac{\cos(\alpha x_0) \pm s}{1\pm s}\right).$$

The overlap s is given by $$s = \exp(-2\gamma x_0^2) \quad (10)$$

This equation is first studied for the approximation where the overlap is neglected. In this approximation the energy is given by $$E = \frac{\gamma}{2} + \frac{1}{8\gamma} + \frac{x_0^2}{2} + \alpha e^{\frac{-\alpha^2}{8\gamma}}\cos(ax_o). \quad (11)$$

Differentiating w.r.t. $x_0$ produces $$x_0 - a\alpha e^{\frac{-\alpha^2}{8\gamma}}\sin(ax_o) = 0, \quad (12)$$

this is the condition for the classical flux modified by quantum fluctuations. Differentiating w.r.t γ produces $$\frac{1}{2} - \frac{1}{8\gamma^2} + \frac{a\alpha^2}{8\gamma^2}e^{\frac{-\alpha^2}{8\gamma}}\cos(ax_0) = 0. \quad (13)$$

The quantum fluctuation factor $$e^{\frac{-\alpha^2}{8\gamma}}$$

which renormalizes a can in all practical cases be replaced by unity. Then with the notation $\phi_0 = \alpha x_0$, the overlap factor s which controls the interwell tunneling rate can be written as $$s = e^{-\sigma^{\frac{1}{2}}\varphi\sqrt{\sin\varphi_0 - \varphi_0\cos\varphi_0}} \quad (14)$$

where $\sigma = (\hbar I_c/2e)/U_C$ is a 'Quantum Dot' parameter, the ratio of Planck constant x hopping frequency across the junction to charging energy $U_C$. When a is small w.r.t unity, the charging energy $U_C$ can be resolved within the time of a tunneling event (time-energy uncertainty relation) and individual pair tunneling is applicable. When the parameter σ is large, then the collective picture of tunneling by superconducting condensate is applicable.

For present purposes, a classic Tsuei-Kirtley situation with collective tunneling and with the $I_C L/\Phi_0$ ratio large w.r.t unity, implying $\phi_0 \approx \pi$, will give a very low tunneling rate due to the large negative exponent. Only by a) approaching the pair tunneling limit, say σ=100, from the collective side, and/or b) by reducing the $I_C L/\Phi_0$ ratio so that, say $\phi_0 \sim \pi/3$, will the tunneling rate become significant. Physically, these two steps respectively reduce the mass, which is proportional to C, and the tunneling barrier, which depends on the $I_C L$ product.

The following table presents numerical estimates for a couple of cases with a 10 micron diameter ring. The width of the ring is W and the energy difference between the bonding and antibonding states is defined as ΔE.

TABLE 1

| W($\mu$) | $I_c(\mu A)$ | L(pH) | C(fF) | $\hbar\hat{\Phi}_0(\mu eV)$ | ΔE($\mu eV$) |
|---|---|---|---|---|---|
| 1 | 20 | 20 | 4 | 350 | 0.5 |
| 0.5 | 20 | 20 | 2.2 | 500 | 12 |

The foregoing Table I illustrates that, with the invention, a reasonable splitting between the ground and excited states of the qubit is achievable with reasonable system parameters that are capable of being fabricated by current lithographic processes.

The Leggett approach for treatment of dissipation follows. The presence of a finite DOS in the gap of a d-wave superconductor, in fact a DOS proportional to energy measured from mid-gap, leads to the possibility of dissipation associated with tunneling even at very low temperature. The excited state of the twin-well system has the possibility to decay into excited quasiparticles near the center of the gap.

The transport at junctions between 2d-wave superconductors has been investigated by several authors, in particular by (Leggett et al., supra), incorporated herein by reference. These authors find an expression for the normal momponent of DC current across the junction as follows $$j_n = a\frac{e^2 V^3}{R_N \Delta_0^2}, \quad (15)$$

where V is voltage across the junction, $R_N$ is the resistance of the junction, $\Delta_0$ is the maximum gap in k-space, and A is a constant of order unity. This result might naively be interpreted as $V^3$ in terms of phase space factors, a factor V arising from the initial DOS going as energy, and another factor V arising from the final DOS. This argument implies that there should be an Ohmic current at finite frequency $\omega$, $$j_N(\omega) = b\frac{V\hbar^2 \omega^2}{R\Delta D_0^2}, \quad (16)$$

where the ($\omega^2$ arises from the initial and final state phase space factors mentioned above, and b is another numerical factor. It is assumed, for the purposes of the following derivation, that this argument is correct, though a detailed derivation along the lines of BGZ would be desirable. Now the dissipative process needs to be incorporated into the tunneling formalism, in order to investigate the magnitude of the resulting decoherence effect ('$T_1$ process').

Since dissipative processes cannot in principle be treated within a Lagrangian formalism, the Leggett and Caldeira stratagem is adopted. This approach considers dissipation as arising from the coupling of the quantum system to a bath of a continuous spectrum of quantum oscillators. Consider, to start with, the Lagrangian for an LCR system, this will have the form:

$$L = \frac{C}{2}\dot{\Phi}^2 + \frac{\Phi^2}{2L} + \sum_i \Phi q_i \gamma_i + \frac{1}{2}\sum_i (\omega_i^2 q_i^2 + \dot{q}_i^2). \quad (17)$$

where the last term is the Lagrangian for the bath, and the penultimate term is the coupling between the bath and the LC system. The corresponding Lagrange equations of motion are linear, and can be solved at finite frequency $\omega$ to give $$-\omega^2 C\Phi + \frac{\Phi}{L} + \sum_i \frac{\Phi \gamma_i^2}{\omega^2 - \omega_i^2} = 0. \quad (18)$$

This should compare with the equation for a simple LCR circuit $$-\omega^2 C\Phi + \frac{\Phi}{L} + \frac{i\omega\Phi}{R} = 0. \quad (19)$$

Comparing the two equations and using the BGZ expression it follows that $$Im\sum_i \frac{\gamma_i^2}{\omega^2 - \omega_i^2 + i\delta} = b\frac{\hbar^2 \omega^3}{R_N \Delta_0^2}, \quad (20)$$

$$\pi \sum_i \frac{\gamma_i^2}{2\omega_i}\delta(\omega - \omega_i) = b\frac{\hbar^2 \omega^3}{R_N \Delta_0^2}. \quad (21)$$

This produces an expression for the weighted DOS of the oscillators consistent with BGZ $$\sum_i \gamma_i^2 \delta(\omega - \omega_i) = b\frac{2}{\pi}\frac{\hbar^2 \omega^4}{R_N \Delta_0^2}. \quad (22)$$

Turning now to the quantum system, the tight binding representation is adopted for simplicity, since the bonding/antibonding energy ΔE is very much smaller than all other energies, this will also be an accurate representation. Adopting a Fermionic representation, the operator $c_a$ is formed for the left hand state of the well, and the operator $c_b$ for the right hand state. The Hamiltonian is $$H = t(c_a^+ c_b + c_b^+ c_a) + \sum_i \lambda_i(b_i^+ + b_i)(n_a - n_b) + \sum_i \omega_i b_i^+ b_i, \quad (23)$$

where the $b_i$ are the boson operators for the bath. The flux at the classical minima in the two tight binding states is defined as $\pm f\Phi_0$, where $f=\frac{1}{2}$ is the ideal half flux quantum state. Equating the coupling terms in the quantum and classical formulations $$\lambda_i(b_i^+ + b_i)(n_a - n_b) = f\Phi_0 q_i \gamma_i, \quad (24)$$

and using the familiar $$(b_i^+ + b_i) = \sqrt{\frac{2\omega_i}{\hbar}} q_i,$$

produces the following $$\gamma_i = \frac{\lambda_i \sqrt{2\omega_i/\hbar}}{f\Phi_0}, \quad (25)$$

so the expression for the boson DOS becomes $$\sum_i \lambda_i^2 \delta(\omega - \omega_i) = \frac{f^2 b}{2} \frac{R_Q \hbar^3 \omega^3}{R_N \Delta_0^2} = \Gamma \omega^3, \quad (26)$$

where $R_{Q=h/e}^2$ is the quantum of resistance. The result is a Quantum formulation, and an expression for the weighted DOS of the quantized bosons, in terms of the parameters of the d-wave Josephson ring.

It turns out that the problem formulated has been extensively investigated by Leggett et al. This is the 'superOhmic' case which is inherently weak coupling. The lifetime broadening can be estimated from the Golden Rule for the process where the excited state of the Quantum system drops down to the ground state, while emitting a boson of energy $\Delta E$:

$$\hbar/\tau = \sum_i \lambda_i^2 \delta(\Delta E - \hbar\omega_i) = \frac{f^2 b}{2} \frac{R_Q \Delta E^3}{R_N \Delta_0^2} \quad (27)$$

so the ratio of lifetime broadening to excitation energy of the Quantum system is $$\frac{\hbar/\tau}{\Delta E} = \frac{f^2 b}{2} \frac{R_Q \Delta E^2}{R_N \Delta_0^2}, \quad (28)$$

so a rather elegant expression is arrived at, involving the ratio of the junction conductance to the quantum of conductance, and the ratio of the excitation energy of the Quantum system to superconducting maximum space gap squared. Taking the estimates of $\Delta E$ found in the above Table, and a value of 30 meV for the maximum space gap, and b=1, the following is obtained:

TABLE II

| $\Delta E (\mu eV)$ | $(\hbar/\tau)/\Delta E$ |
|---|---|
| .5 | $9 \times 10^{-10}$ |
| 12 | $5 \times 10^{-7}$ |

These estimates are within the frequently quoted value $10^{-5}$ (e.g. see Loss, Daniel and David P. DiVicenzo, supra), verifying that the inventive Qubit is stable towards $T_1$ processes.

An estimate of the lifetime of the excited state may be obtained from Eq. (28), giving an estimate of the quantum phase coherence. Results estimating the quantum coherence are collected in Table II, based on a value of high temperature superconducting gap, with a maximum gap of 40 meV and when coherence times of $10^{-9}$ to $10^{-6}$ cycles can be estimated. This is within the range ($10^{-5}$ cycles) of values considered acceptable in Quantum Computer applications (e.g., see Loss, Daniel and David P. DiVicenzo, supra).

Earlier proposals for a Josephson Junction based qubit exist most importantly in a recent experimental paper (e.g., see Y. Nakamura et al., Nature 398, 786 (1999)incorporated herein by reference). However, these suggestions involve conventional s-wave superconductors and do not utilize any structure similar to the inventive d-wave qubit.

There is intrinsically a major problem with the use of s-wave superconducting Josephson rings, in that the twin-well energy structure of FIG. 7 is replaced by a three well structure with the central well being the deepest. Only by applying a magnetic field with just the right value can twin energy wells be recovered with a conventional s-wave structure (as shown in FIG. 6). To the contrary, with the inventive d-wave qubit, the two wells have exactly the same energy. The requirement for this tunable magnetic field to be present is a major complication rendering the s-wave based Josephson qubit far more complicated and less reliable than the inventive d-wave structure.

While other d-wave superconductor based qubits have been proposed in the past (e.g., see L. B. Ioffe et al., "Environmentally decoupled SDS-wave Josephson Junctions for Quantum Computing", Nature 398, 679 (1999) and A. M. Zagoskin, "A Scalable, tunable Qubit on a clean DND or Grain Boundary -D Junction: cond-mat/9903 170, Mar. 10, 1999, both incorporated herein by reference), these proposals are both quite different from the present invention. The concept described in L. B. Ioffe et al. is fundamentally based on a phenomenon of nonsinusoidal Josephson current-phase relationship, for which there is practically no experimental evidence. Moreover, L. B. Ioffe et al. includes an SNS junction which has poor Quantum Coherence characteristics. Further, in L. B. Ioffe et al. no meaningful estimate of the coherence behavior are given. Similarly, in A. M. Zagoskin, the qubit states are 0 and 1, instead of being related to the classical 'up' and 'down' flux states of an electrode arrangement. Further, these proposals lack independent loops.

As explained above, the invention allows cubic structures to be formed in a high density matrix. Also, the quantum coherence of the inventive cubit is maintained sufficiently to allow high performance operation of a quantum computer. Additionally, the inventive qubits are capable of being influenced by an external magnetic field so that they can selectively interact with one another.

While the invention has been described in terms of preferred embodiments, those skilled in the art will recognize that the invention can be practiced with modification within the spirit and scope of the appended claims.

What is claimed is:

1. A d-wave qubit structure comprising:
    a qubit comprising a multi-crystal junction of d-wave superconducting crystalline structures,
    wherein orientations of said multi-crystal junction are such that said qubit spontaneously generates a magnetic flux of plus or minus one-half quantum that is quantum mechanically hybridized.

2. The d-wave qubit in claim 1, further comprising a superconducting sensing loop.

3. The d-wave qubit in claim 2, wherein said superconducting sensing loop comprises an s-wave superconducting ring.

4. The d-wave qubit in claim 1, further comprising a superconducting field effect transistor.

5. The d-wave qubit in claim 1, further comprising a superconducting screening structure surrounding said qubit, wherein said superconducting screening structure comprises one of Cuprate, Niobium and Lead.

6. The d-wave qubit in claim 1, further comprising a substrate,
    wherein said qubit is formed on said substrate, and further comprising a superconducting screening structure surrounding said qubit, and
    wherein said superconducting screening structure is formed on said substrate.

7. An array of d-wave qubit structures, each of said d-wave qubit structures comprising:
    a qubit comprising a multi-crystal junction of d-wave superconducting crystalline structures, wherein orientations of said multi-crystal junction are such that said qubit spontaneously generates a magnetic flux of plus or minus one-half quantum that is quantum mechanically hybridized.

8. The array in claim 7, further comprising a superconducting sensing loop.

9. The array in claim 8, wherein said superconducting sensing loop comprises an s-wave superconducting ring.

10. The array in claim 7, further comprising a superconducting field effect transistor.

11. The array in claim 7, further comprising a superconducting screening structure surrounding said qubit, wherein said superconducting screening structure comprises one of Cuprate, Niobium and Lead.

12. The array in claim 7, further comprising a substrate, wherein said qubit is formed on said substrate, and further comprising a superconducting screening structure surrounding said qubit, and wherein said superconducting screening structure is formed on said substrate.

13. A quantum computer including at least one array of d-wave qubit structures, each of said d-wave qubit structures comprising:

a qubit comprising a multi-crystal junction of d-wave superconducting crystalline structures, wherein orientations of said multi-crystal junction are such that said qubit spontaneously generates a magnetic flux of plus or minus one-half quantum that is quantum mechanically.

14. The quantum computer in claim 13, further comprising a superconducting sensing loop.

15. The quantum computer in claim 14, wherein said superconducting sensing loop comprises an s-wave superconducting ring.

16. The quantum computer in claim 13, further comprising a superconducting field effect transistor.

17. The quantum computer in claim 13, further comprising a superconducting screening structure surrounding said qubit, wherein said superconducting screening structure comprises one of Cuprate, Niobium and Lead.

18. The quantum computer in claim 13, further comprising a substrate, wherein said qubit is formed on said substrate, and further comprising a superconducting screening structure surrounding said qubit, and wherein said superconducting screening structure is formed on said substrate.

* * * * *